(12) United States Patent
Fan et al.

(10) Patent No.: US 12,098,732 B2
(45) Date of Patent: Sep. 24, 2024

(54) LIQUID COOLING HEAD WITH A HEAT DISSIPATING LIQUID FLOWING FROM A COOLING PLATE TO AN IMPELLER

(71) Applicant: Auras Technology Co., Ltd., New Taipei (TW)

(72) Inventors: Mu-Shu Fan, New Taipei (TW); Chien-Yu Chen, New Taipei (TW); Ming-Yuan Chiang, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 167 days.

(21) Appl. No.: 17/864,236

(22) Filed: Jul. 13, 2022

(65) Prior Publication Data
US 2023/0067553 A1    Mar. 2, 2023

Related U.S. Application Data

(60) Provisional application No. 63/237,328, filed on Aug. 26, 2021.

(51) Int. Cl.
| | |
|---|---|
| *F04D 29/58* | (2006.01) |
| *F04D 29/42* | (2006.01) |
| *H05K 7/20* | (2006.01) |
| *F04D 17/02* | (2006.01) |
| *F04D 25/06* | (2006.01) |

(52) U.S. Cl.
CPC ..... *F04D 29/5806* (2013.01); *F04D 29/4293* (2013.01); *H05K 7/20254* (2013.01); *H05K 7/20272* (2013.01); *H05K 7/20327* (2013.01); *H05K 7/2039* (2013.01); *H05K 7/20418* (2013.01); *F04D 17/025* (2013.01); *F04D 25/06* (2013.01); *F04D 29/426* (2013.01); *F04D 29/588* (2013.01); *H05K 7/20318* (2013.01)

(58) Field of Classification Search
None
See application file for complete search history.

(56) References Cited

U.S. PATENT DOCUMENTS

| | | | |
|---|---|---|---|
| 10,001,133 B2* | 6/2018 | Doll | F04D 29/2277 |
| 10,323,654 B2* | 6/2019 | Zhang | F04D 13/0646 |
| 2006/0171801 A1* | 8/2006 | Manabe | H01L 23/473 |
| | | | 415/176 |
| 2009/0159244 A1* | 6/2009 | Mounioloux | G06F 1/20 |
| | | | 165/104.33 |
| 2017/0248154 A1* | 8/2017 | Nakaniwa | F04D 29/442 |

* cited by examiner

*Primary Examiner* — Nathan C Zollinger
*Assistant Examiner* — Timothy P Solak
(74) *Attorney, Agent, or Firm* — MUNCY, GEISSLER, OLDS & LOWE, P.C.

(57) ABSTRACT

A liquid cooling head includes an upper casing, an impeller, a bottom casing and a skived fin cooling plate. The upper casing has an inlet and an outlet, the upper casing is fixed on the bottom casing, and the impeller is arranged between the upper casing and the skived fin cooling plate. In addition, the skived fin cooling plate is fixed on the bottom casing, and the impeller sucks the heat-dissipating liquid from the inlet and drives the heat-dissipating liquid passing through the skived fin cooling plate, upwardly passing through the impeller and then discharged from the outlet.

11 Claims, 5 Drawing Sheets

LIQUID COOLING HEAD WITH A HEAT DISSIPATING LIQUID FLOWING FROM A COOLING PLATE TO AN IMPELLER

RELATED APPLICATIONS

This application claims priority to U.S. Provisional Application Ser. No. 63/237,328, filed Aug. 26, 2021, the disclosures of which are incorporated herein by reference in their entireties.

TECHNICAL FIELD

The present disclosure generally relates to a liquid cooling head. More particularly, the present disclosure relates to a liquid cooling head with an inverted pump.

BACKGROUND

With the advancement of technology, electronic products have become more popular, and gradually changed the life or work of many people. As the calculating power of the computers increases, the temperature control of the electronic components such as the processor is more important.

Electronic components such as the processor generate heat during operation and require proper cooling to achieve the best performance. In order to keep the central processing unit and other electronic components operating at a proper temperature, a liquid cooling device or an air cooling device is usually used.

In the current liquid cooling heat dissipation device, the working fluid flows into the liquid cooling head through the pipeline, and the liquid cooling head contacts the surface of the electronic component, e.g. the processor, to take away the heat generated by the electronic component during operation, thereby reducing the operating temperature of the electronic component, and improving the working efficiency of the electronic component.

However, with the increasing heat dissipation demand, there is a need to reduce the working temperature of the motor in the liquid cooling head so as to improve the performance and efficiency of the liquid cooling head and further improve the performance and efficiency of the electronic product with the liquid cooling head.

SUMMARY

One objective of the embodiments of the present invention is to provide a liquid cooling head to improve the cooling efficiency of the liquid cooling head and further improve the working efficiency of the electronic product.

To achieve these and other advantages and in accordance with the objective of the embodiments of the present invention, as the embodiment broadly describes herein, the embodiments of the present invention provides a liquid cooling head including an upper casing, an impeller, a bottom casing, and a skived fin cooling plate. The upper casing has an inlet and an outlet, the upper casing is fixed on the bottom casing, and the skived fin cooling plate is fixed on the bottom casing, and the impeller is arranged between the upper casing and the skived fin cooling plate. In addition, the impeller sucks a heat dissipating liquid entering from the inlet and drives the heat dissipating liquid to flow through the skived fin cooling plate, flow upward through the impeller and then discharge from the outlet.

In some embodiments, the impeller includes at least one axial blade and at least one centrifugal blade configured on the at least one axial blade, and the at least one axial blade sucks the heat dissipating liquid into the at least one centrifugal blade from bottom to top.

In some embodiments, the impeller further includes a hub and a rotational ring. The at least one axial blade is fixed around the hub and the rotational ring is fixed around the at least one axial blade.

In some embodiments, the impeller further includes a plurality of permanent magnets fixed around the rotational ring.

In some embodiments, the liquid cooling head further includes an intermediate casing, the intermediate casing includes an opening, and the impeller passes through the opening of the intermediate casing.

In some embodiments, the at least one centrifugal blade of the impeller is disposed on the intermediate casing, and the rotational ring of the impeller passes through the opening of the intermediate casing.

In some embodiments, the upper casing further includes a raised portion, a rotational shaft is fixed in the raised portion, the raised portion passes through a raised portion hole of the impeller, and the rotational shaft passes through a shaft hole of the hub to allow the impeller rotating around the rotational shaft.

In some embodiments, the liquid cooling head further includes a stator fixed in the intermediate casing and the stator is immersed in the heat dissipating liquid.

In some embodiments, the stator includes an upper wire frame, a bottom wire frame, a plurality of silicon steel sheets and a coil. The silicon steel sheets are fixed between the upper wire frame and the bottom wire frame and the coil is wound around the silicon steel sheets, and the upper wire frame, the bottom wire frame, the silicon steel sheets and the coil are immersed in the heat dissipating liquid.

In some embodiments, the silicon steel sheets further include a waterproof protective layer coated on the silicon steel sheets.

In some embodiments, the waterproof protective layer is an epoxy layer, an electroless nickel plating layer or an ultraviolet curable adhesive layer.

In some embodiments, the upper casing further includes an inlet channel protrusion to form a curved inlet channel connected to the inlet to guide the heat dissipating liquid through the upper casing and the intermediate casing to the skived fin cooling plate at a bottom.

In some embodiments, a drainage space is formed between the inlet channel protrusion and a raised portion of the upper casing to accommodate the centrifugal blade, and the drainage space is connected to the outlet, and the curved inlet channel is located beside the inlet channel protrusion and opposite to the drainage space.

In some embodiments, the bottom casing includes a bottom casing protrusion, two bottom casing inlets and a bottom casing outlet. The bottom casing outlet is formed in a center of the bottom casing protrusion, two bottom casing inlets are located on both sides of the bottom casing protrusion, and the bottom casing protrusion is sleeved around the rotational ring of the impeller.

Hence, the liquid cooling head has an inversed pump able to draw the heat dissipating liquid to flow from the inlet on the top down to the cooling plate at the bottom and flow through the stator and the rotor to effectively reduce the temperatures of the stator and the rotor so as to increase the cooling efficiency of the liquid cooling head and utilize the pressure of the heat dissipating liquid to lift the impeller upward when the impeller rotates so as to reduce the frictional force of the impeller and further improve the working efficiency of the liquid cooling head.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
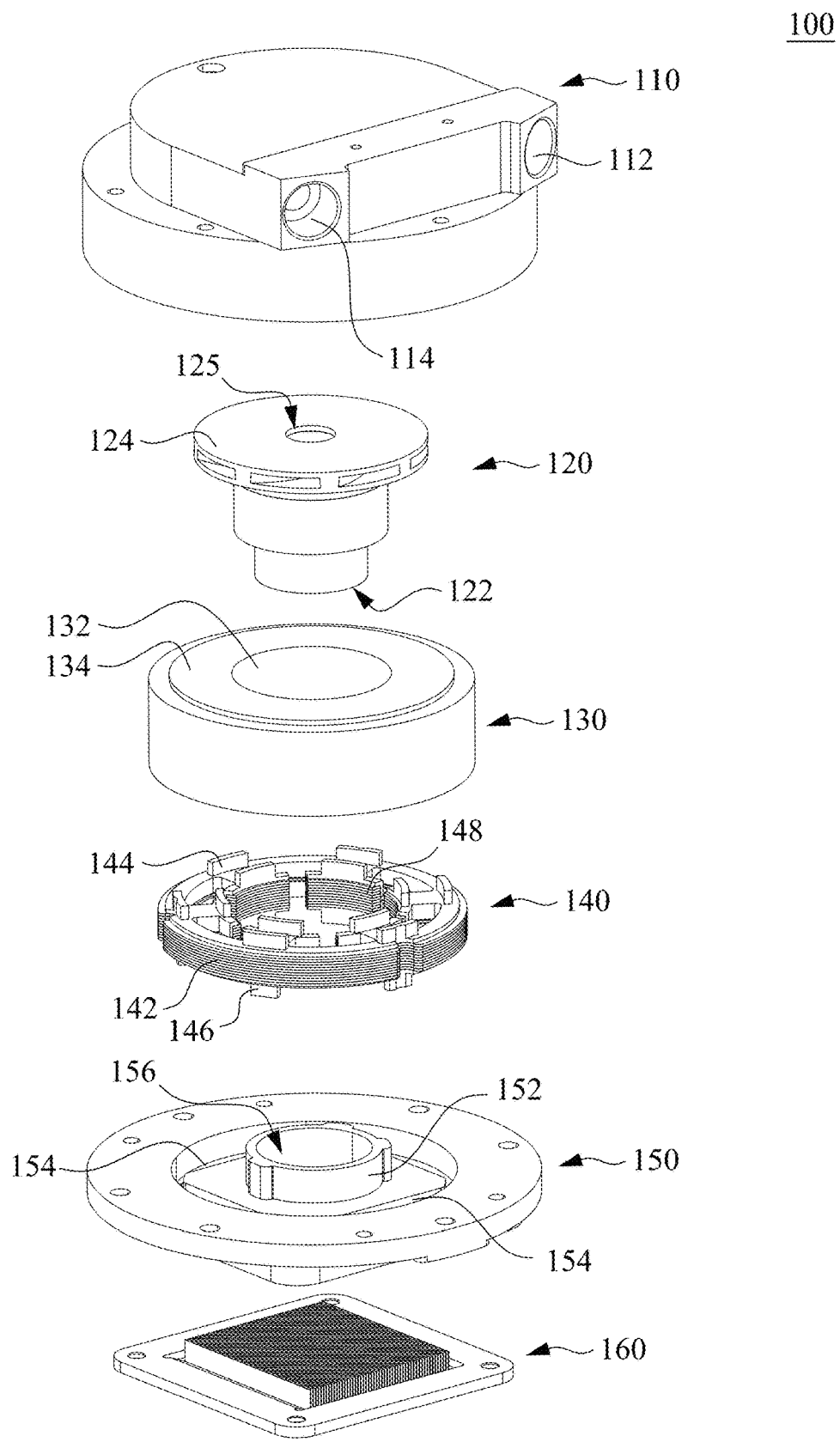
FIG. 1 illustrates a schematic exploded view showing a liquid cooling head according to one embodiment of the present invention.
Figure 2:
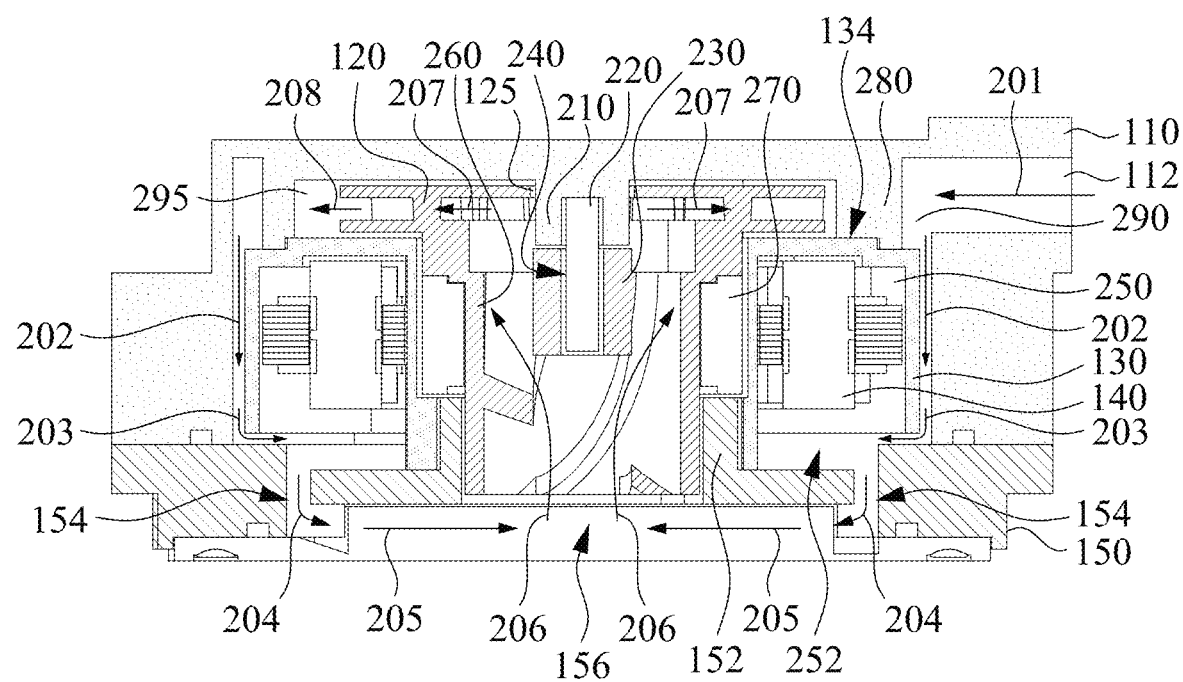
FIG. 2 illustrates a schematic cross-sectional view of the liquid cooling head of FIG. 1.
Figure 3:
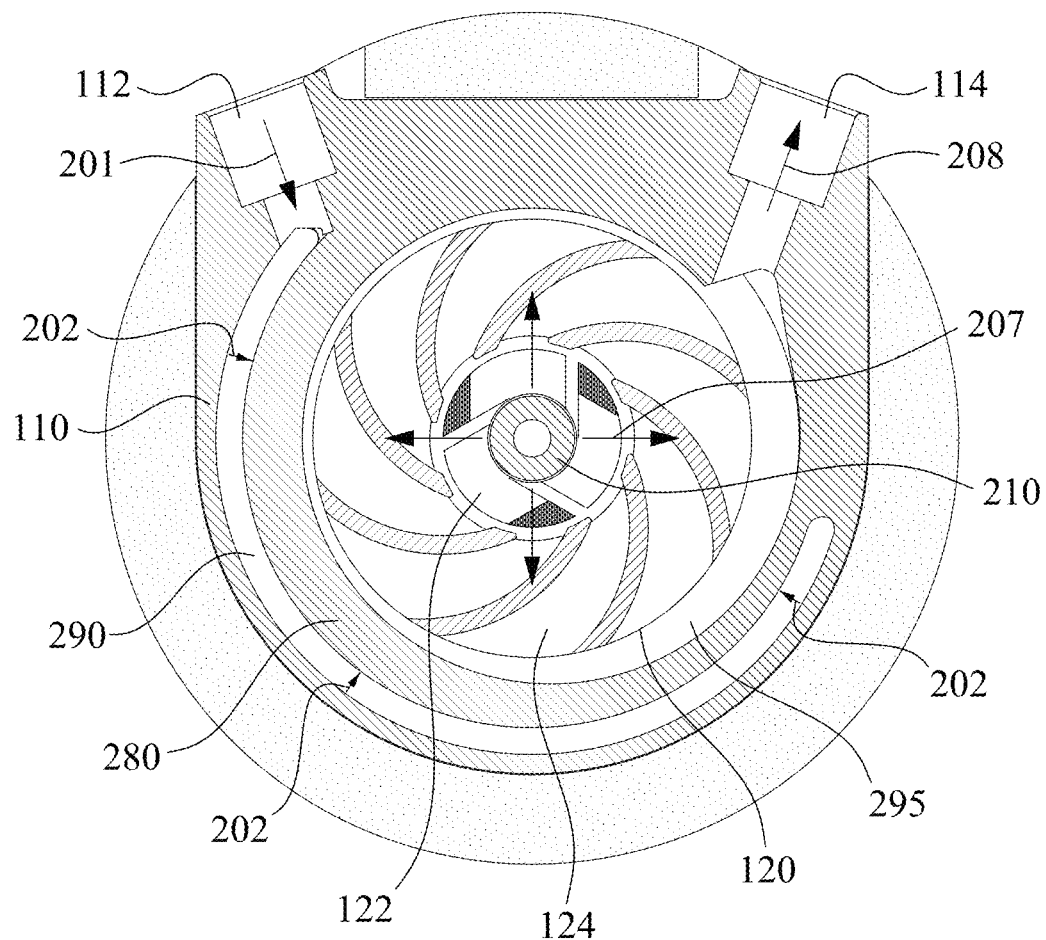
FIG. 3 illustrates a schematic top cross-sectional view of the liquid cooling head of FIG. 1.
Figure 4:
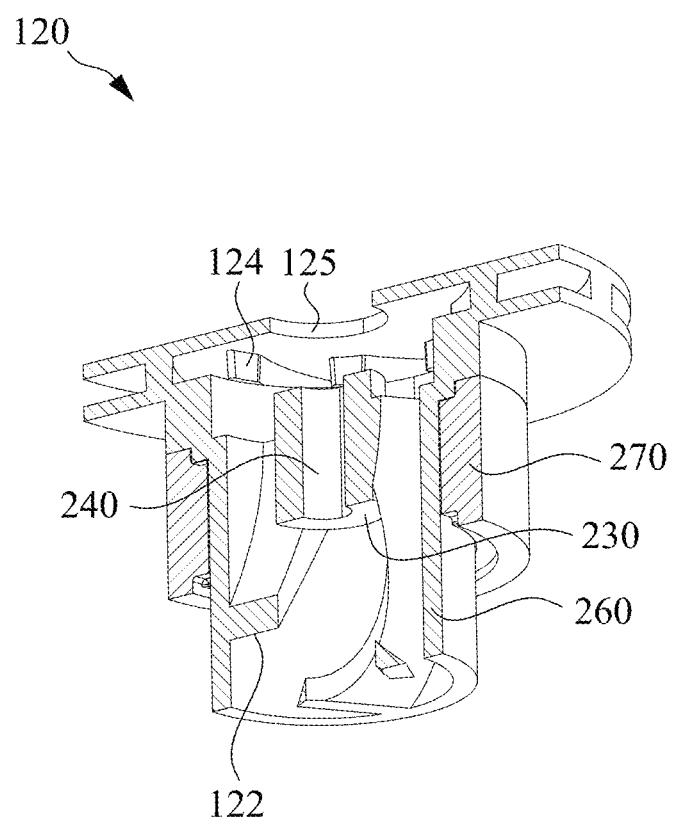
FIG. 4 illustrates a schematic cross-sectional view of the impeller of the liquid cooling head.
Figure 5:
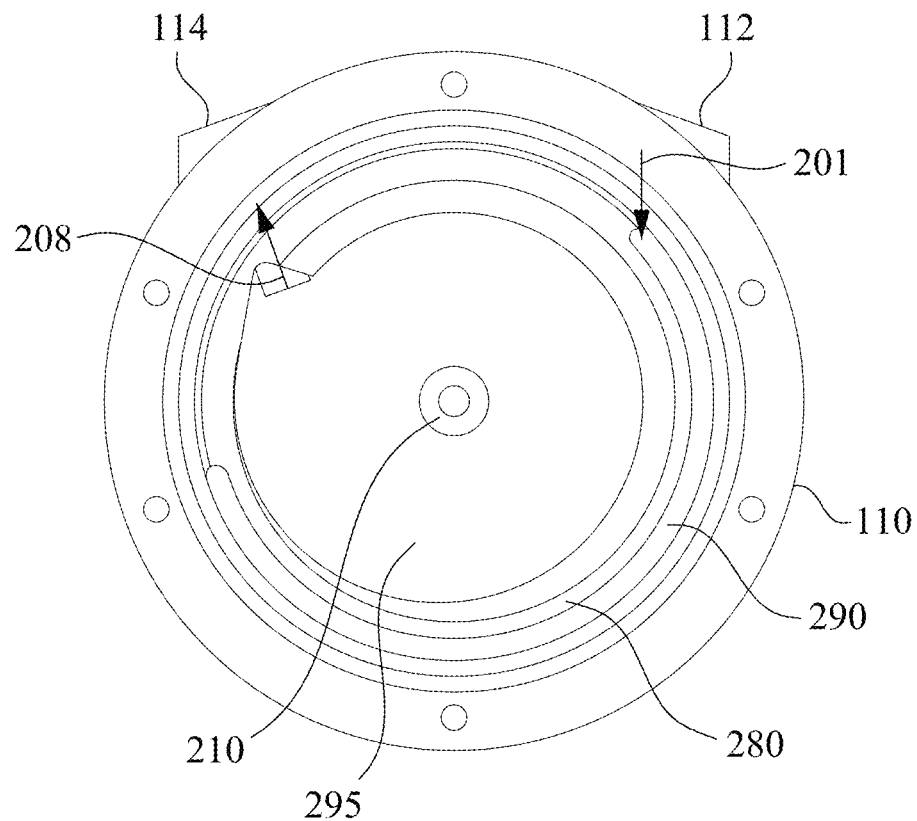
FIG. 5 illustrates a schematic bottom view of the upper casing of the liquid cooling head.

FIG. 1 illustrates a schematic exploded view of a liquid cooling head according to one embodiment of the present invention, FIG. 2 illustrates a schematic cross-sectional view thereof, FIG. 3 illustrates a schematic top cross-sectional view thereof, FIG. 4 illustrates a schematic cross-sectional view of the impeller thereof, and FIG. 5 illustrates a schematic bottom view of the upper casing thereof.

Referring first to FIG. 1 to FIG. 3, a liquid cooling head 100 includes an upper casing 110, an impeller 120, an intermediate casing 130, a stator 140, a bottom casing 150 and a skived fin cooling plate 160. The upper casing 110 includes an inlet 112 and an outlet 114, the upper casing 110 is fixed on the bottom casing 150, and the intermediate casing 130 is fixed between the upper casing 110 and the bottom casing 150. The impeller 120 is arranged between the upper casing 110 and the skived fin cooling plate 160, the intermediate casing 130 includes an opening 132, and the impeller 120 passes through the opening 132 of the intermediate casing 130.

In addition, the skived fin cooling plate 160 is fixed to the bottom casing 150. When the impeller 120 sucks the heat dissipating liquid entering from the inlet 112, the heat dissipating liquid first enters into the curved inlet channel 290 along the arrow direction 201, and then flows downward through the flowing path between the intermediate casing 130 and the upper casing 110 along the arrow direction 202. Subsequently, the heat dissipating liquid flows to a bottom of the intermediate casing 130 along the arrow direction 203, and the stator 140 is immersed in the heat dissipating liquid to improve the cooling efficiency of the stator 140. In addition, the heat dissipating liquid enters into the flowing paths in the skived fin cooling plate 160 along the arrow direction 204 and flows to the center of the skived fin cooling plate 160 along the arrow direction 205 to remove the heat from the skived fin cooling plate 160. Subsequently, the heat dissipating liquid is drawn axially upwards along the arrow direction 206 by rotating the impeller 120, and then is centrifugally thrown from the impeller 120 along the arrow direction 207, and discharged from the outlet 114 along the arrow direction 208.

In some embodiments, the stator 140 is fixed on the intermediate casing 130, and it is worth noting that the stator 140 is immersed in the heat dissipating liquid so that the heat on the stator 140, the impeller 120 and the skived fin cooling plate 160 is dissipated by the heat dissipating liquid of the liquid cooling head 100 to improve the cooling efficiency of the liquid cooling head 100 and reduce the working temperatures of the stator 140, the impeller 120 and the skived fin cooling plate 160.

In some embodiments, the intermediate casing 130 includes an accommodating trough 250, the stator 140 is accommodated in the accommodating trough 250, and the trough opening 252 of the accommodating trough 250 is located on the bottom side of the intermediate casing 130 and faces downward toward the bottom casing 150.

In some embodiments, further referring to FIG. 4, the impeller 120 includes a hub 230, a rotational ring 260, at least one axial blade 122, and at least one centrifugal blade 124. The centrifugal blade 124 is configured on the axial blade 122, the axial blade 122 is fixed between the hub 230 and the rotational ring 260. That is to say, the axial blade 122 is fixed around the hub 230, and the rotational ring 260 is fixed around the axial blade 122. A flowing path is formed between the hub 230 and the rotational ring 260 so that the heat dissipating liquid is sucked upward from the bottom to the centrifugal blade 124 by the axial blade 122, and then the heat dissipating liquid is thrown from the impeller 120 by way of the centrifugal blade 124.

In some embodiments, the impeller 120 further includes a plurality of permanent magnets 270 fixed around the rotational ring 260 to form a rotor.

In some embodiments, the centrifugal blade 124 of the impeller 120 is arranged on the intermediate casing 130, and the rotational ring 260 of the impeller 120 passes through the opening 132 of the intermediate casing 130. In addition, the diameter of the centrifugal blade 124 is larger than the diameter of the opening 132 of the intermediate casing 130, and the diameter of the rotational ring 260 including the permanent magnets 270 of the impeller 120 is smaller than the diameter of the opening 132 of the intermediate casing 130.

In some embodiments, the upper casing 110 further includes a raised portion 210 and a rotational shaft 220, the raised portion 210 passes through the raised portion hole 125 formed on the upper surface of the impeller 120, and the rotational shaft 220 is fixed in the raised portion 210 and passes through the shaft hole 240 of the hub 230 to allow the impeller 120 stably rotating along the rotational shaft 220. In some embodiments, the shaft hole 240 is a through hole located in the center of the hub 230 but not limited to this.

In some embodiments, the stator 140 includes an upper wire frame 144, a bottom wire frame 146, a plurality of silicon steel sheets 142 and a coil 148. The silicon steel sheets 142 are stacked together and fixed between the upper wire frame 144 and the bottom wire frame 146, and the coil 148 is wound around the silicon steel sheets 142. It is worth noting that the upper wire frame 144, the bottom wire frame 146, the silicon steel sheets 142 and the coil 148 are immersed in the heat dissipating liquid to reduce the working temperature thereof.

In some embodiments, the silicon steel sheets 142 further include a waterproof protective layer, for example an epoxy layer, an electroless nickel plating layer or an ultraviolet curable adhesive layer, coated on the silicon steel sheets 142.

In some embodiments, simultaneously referring to FIG. 2 and FIG. 5, the upper casing 110 further includes an inlet channel protrusion 280 downward protruded to seal on the upper surface 134 of the intermediate casing 130 to form a drainage space 295 between the inlet channel protrusion 280 and the raised portion 210 to accommodate the centrifugal blade 124, and the drainage space 295 is connected to the outlet 114. In addition, a curved inlet channel 290 is formed on a side, opposite to the drainage space 295, of the inlet channel protrusion 280, and the curved inlet channel 290 connected to the inlet 112 effectively guides the heat dissipating liquid to flow downward to the skived fin cooling plate 160 through the upper casing 110 and the intermediate casing 130.

In some embodiments, the diameter of the shaft hole 240 of the hub 230 is larger than the diameter of the rotational shaft 220 to allow the impeller 120 to rotate around the rotational shaft 220.

In some embodiments, referring to FIG. 1 and FIG. 2, the bottom casing 150 includes a bottom casing protrusion 152, two bottom casing inlets 154 and a bottom casing outlet 156. The bottom casing outlet 156 is formed in the center of the bottom casing protrusion 152, and the two bottom casing inlets 154 are formed on both sides of the bottom casing protrusion 152. That is to say, two bottom casing inlets 154 are located on two sides of the bottom casing outlet 156, and the bottom casing outlet 156 is located between the bottom casing inlets 154 to allow the heat dissipating liquid flowing into the flowing paths in the skived fin cooling plate 160 through two sides of the skived fin cooling plate 160 along the arrow direction 204, flowing to the center of the skived fin cooling plate 160 along the arrow direction 205, and flowing upwardly into the impeller 120 from the bottom casing outlet 156. In addition, the bottom casing protrusion 152 is sleeved around the rotational ring 260 of the impeller 120. Therefore, the rotational ring 260 of the impeller 120 is directly communicated with the bottom casing outlet 156 to effectively and steadily suck the heat dissipating liquid into the impeller 120.

Accordingly, the liquid cooling head has an inversed pump able to draw the heat dissipating liquid to flow from the inlet on the top down to the cooling plate at the bottom and flow through the stator and the rotor to effectively reduce the temperatures of the stator and the rotor so as to increase the cooling efficiency of the liquid cooling head and utilize the pressure of the heat dissipating liquid to lift the impeller upward when the impeller rotates so as to reduce the frictional force of the impeller and further improve the working efficiency of the liquid cooling head.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A liquid cooling head, comprising:
   an upper casing, having an inlet and an outlet;
   an impeller;
   a bottom casing, wherein the upper casing is fixed on the bottom casing; and
   a skived fin cooling plate, fixed on the bottom casing, wherein the impeller is arranged between the upper casing and the skived fin cooling plate, wherein the impeller sucks a heat dissipating liquid entering from the inlet and drives the heat dissipating liquid to flow through the skived fin cooling plate upwardly through the impeller and then discharged from the outlet, wherein the impeller comprises:
   at least one axial blade; and
   at least one centrifugal blade configured on the at least one axial blade, wherein the at least one axial blade sucks the heat dissipating liquid into the at least one centrifugal blade from bottom to top, wherein the impeller further comprises:
   a hub, wherein the at least one axial blade is fixed around the hub; and
   a rotational ring fixed around the at least one axial blade, wherein the impeller further comprises:
   a plurality of permanent magnets fixed around the rotational ring.

2. The liquid cooling head of claim 1, further comprising:
   an intermediate casing, wherein the intermediate casing comprises an opening, and the impeller passes through the opening of the intermediate casing.

3. The liquid cooling head of claim 2, wherein the at least one centrifugal blade of the impeller is disposed in the intermediate casing, and the rotational ring of the impeller passes through the opening of the intermediate casing.

4. The liquid cooling head of claim 3, wherein the upper casing further comprises a raised portion, a rotational shaft is fixed in the raised portion, the raised portion passes through a raised portion hole of the impeller, and the rotational shaft passes through a shaft hole of the hub to allow the impeller to rotate around the rotational shaft.

5. The liquid cooling head of claim 2, further comprising:
   a stator fixed in the intermediate casing, wherein the stator is immersed in the heat dissipating liquid.

6. The liquid cooling head of claim 5, wherein the stator comprises:
   an upper wire frame;
   a bottom wire frame;
   a plurality of silicon steel sheets fixed between the upper wire frame and the bottom wire frame; and
   a coil wound around the silicon steel sheets, wherein the upper wire frame, the bottom wire frame, the silicon steel sheets and the coil are immersed in the heat dissipating liquid.

7. The liquid cooling head of claim 6, wherein the silicon steel sheets further comprise a waterproof protective layer coated on the silicon steel sheets.

8. The liquid cooling head of claim 7, wherein the waterproof protective layer is an epoxy layer, an electroless nickel plating layer or an ultraviolet curable adhesive layer.

9. The liquid cooling head of claim 2, wherein the upper casing further comprises an inlet channel protrusion to form a curved inlet channel connected to the inlet to guide the heat dissipating liquid through the upper casing and the intermediate casing to the skived fin cooling plate at a bottom.

10. The liquid cooling head of claim 9, wherein a drainage space is formed between the inlet channel protrusion and a raised portion of the upper casing to accommodate the centrifugal blade, and the drainage space is connected to the outlet, and the curved inlet channel is located beside the inlet channel protrusion and opposite to the drainage space.

11. A liquid cooling head, comprising:
    an upper casing, having an inlet and an outlet;
    an impeller;
    a bottom casing, wherein the upper casing is fixed on the bottom casing; and a skived fin cooling plate, fixed on the bottom casing, wherein the impeller is arranged between the upper casing and the skived fin cooling plate, wherein the impeller sucks a heat dissipating liquid entering from the inlet and drives the heat dissipating liquid to flow through the skived fin cooling plate upwardly through the impeller and then discharged from the outlet, wherein the impeller comprises:

at least one axial blade; and at least one centrifugal blade configured on the at least one axial blade, wherein the at least one axial blade sucks the heat dissipating liquid into the at least one centrifugal blade from bottom to top, wherein the impeller further comprises:

a hub, wherein the at least one axial blade is fixed around the hub; and a rotational ring fixed around the at least one axial blade, wherein the bottom casing comprises a bottom casing protrusion, two bottom casing inlets and a bottom casing outlet, wherein the bottom casing outlet is formed in a center of the bottom casing protrusion, the two bottom casing inlets are located on both sides of the bottom casing protrusion, and the bottom casing protrusion is sleeved around the rotational ring of the impeller.

* * * * *